(12) United States Patent
Seebacher et al.

(10) Patent No.: US 10,763,228 B2
(45) Date of Patent: Sep. 1, 2020

(54) COMPENSATION DEVICE FOR TRANSISTORS

(71) Applicant: Infineon Technologies AG, Neubiberg (DE)

(72) Inventors: David Seebacher, Villach (AT); Andrea Del Chiaro, Villach (AT); Peter Singerl, Villach (AT); Ji Zhao, Villach (AT)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 16/229,379

(22) Filed: Dec. 21, 2018

(65) Prior Publication Data

US 2019/0198465 A1 Jun. 27, 2019

(30) Foreign Application Priority Data

Dec. 22, 2017 (DE) .................. 10 2017 131 216

(51) Int. Cl.
| | |
|---|---|
| *H03F 3/16* | (2006.01) |
| *H01L 23/66* | (2006.01) |
| *H03F 3/217* | (2006.01) |
| *H03F 1/34* | (2006.01) |
| *H03F 3/195* | (2006.01) |
| *H03F 1/08* | (2006.01) |
| *H01L 23/00* | (2006.01) |

(52) U.S. Cl.
CPC ............ *H01L 23/66* (2013.01); *H01L 24/49* (2013.01); *H03F 1/086* (2013.01); *H03F 1/342* (2013.01); *H03F 1/347* (2013.01); *H03F 3/195* (2013.01); *H03F 3/2171* (2013.01); *H01L 2223/6611* (2013.01); *H01L 2224/48095* (2013.01); *H01L 2224/48195* (2013.01); *H01L 2224/49052* (2013.01); *H01L 2224/49096* (2013.01); *H01L 2224/49109* (2013.01); *H01L 2224/49111* (2013.01); *H01L 2224/49175* (2013.01); *H01L 2924/00014* (2013.01); *H03F 2203/45172* (2013.01); *H03F 2203/45228* (2013.01)

(58) Field of Classification Search
CPC ........................................................ H03F 3/16
USPC .................................................. 330/165, 276
See application file for complete search history.

(56) References Cited

U.S. PATENT DOCUMENTS

| | | | | |
|---|---|---|---|---|
| 3,681,711 A | * | 8/1972 | Hanby | ...................... H03K 3/30 331/112 |
| 5,164,683 A | | 11/1992 | Shields | |
| 5,225,972 A | | 7/1993 | Sakamoto | |
| 6,300,827 B1 | | 10/2001 | King | |
| 7,800,448 B2 | * | 9/2010 | Blednov | ............... H03F 1/0288 330/124 R |

(Continued)

FOREIGN PATENT DOCUMENTS

EP      1873829 A2     1/2008

*Primary Examiner* — Henry Choe
(74) *Attorney, Agent, or Firm* — Murphy, Bilak & Homiller, PLLC

(57) ABSTRACT

Devices including a transistor having a parasitic capacitance between a control terminal and a load terminal of a first type are provided. Furthermore, the devices include advantageously arranged inductances which are electromagnetically coupled to one another and are configured at least partly to compensate for an effect of the parasitic capacitance in a range around a resonant frequency.

6 Claims, 4 Drawing Sheets

(56) References Cited

U.S. PATENT DOCUMENTS

| | | | |
|---|---|---|---|
| 8,446,217 B2* | 5/2013 | Bagga | H03F 1/342 330/104 |
| 8,610,506 B2* | 12/2013 | Mineyama | H03F 3/217 330/188 |
| 10,038,407 B2* | 7/2018 | Moronval | H01L 24/06 |
| 2011/0148527 A1 | 6/2011 | Bagga | |
| 2012/0218041 A1 | 8/2012 | Mineyama | |

* cited by examiner

COMPENSATION DEVICE FOR TRANSISTORS

TECHNICAL FIELD

This disclosure relates generally to devices for radiofrequency transistors.

BACKGROUND

Development in the field of radiofrequency applications, in particular in communication systems, is heading more and more in the direction of amplifier circuits having smaller dimensions in conjunction with higher power and at the same time subject to the requirement of coping with greater bandwidths of signals to be processed. In order that the space requirement of corresponding amplifier circuits or other radiofrequency circuits is kept compact, the degree of integration of the amplifier circuits is being progressively increased. For power amplifier circuits this means considerable challenges with regard both to efficiency and to linearity and circuit stability. This applies with regard to Doherty power amplifier circuits. The latter are used in a large number of fields of application and frequency ranges, for example in the field of mobile radio systems, for example 5G and MIMO systems, or else in the field of broadcasting, and also in other wireless applications such as e.g.: WLAN.

Transistors, in particular power transistors and/or radiofrequency transistors, are a constituent of many power amplifier circuits. For some types of transistors, a capacitance between a control terminal and a load terminal of the transistor can lead to an undesired feedback behavior that can result in undesired effects, for example instabilities of the power amplifier circuit during operation of the transistor.

One conventional procedure for ensuring the stability of the transistor consists in adding a stability resistance for damping oscillations that possibly occur. A transistor having a gate terminal is used as transistor in some cases. In these cases, said resistance can be connected to the gate terminal of the transistor. In this case, however, the resistance can bring about additional disadvantageous effects for the power circuit; by way of example, the gain factor of the power circuit can be reduced by the resistance and/or the resistance can lead to a non-ideal behavior of the gain as a function of the circuit frequency, which can be problematic in particular for Doherty amplifier circuits. This applies in particular to cases in which gallium nitride transistors (GAN transistors) are used, which may have strong feedback properties. As a result of large changes in a gain factor of such an amplifier circuit with frequency, an input matching network used can be mismatched in some cases, which can result in a further loss of gain and possibly of system efficiency and hampers the design of circuits for a wide frequency range.

In order to compensate for the effects described above, in some applications it is possible to use a feedback system network comprising at least one resistance, one inductance and one capacitance (RLC network) between a control terminal and a load terminal of a transistor. In this case, the additional capacitance is used for DC voltage decoupling since load terminal and control terminal are generally at different potentials. However, said additional capacitance of the feedback network can likewise lead to undesired, disadvantageous effects.

SUMMARY

In accordance with one exemplary embodiment, a device comprising a transistor having at least one control terminal, at least one load terminal of a first type and at least one load terminal of a second type is provided. In this case, the transistor has a parasitic capacitance between the at least one control terminal and the at least one load terminal of the first type. Furthermore, the device comprises a first inductance, which is conductively connected to the at least one control terminal, and also a second inductance, which is conductively connected to the at least one load terminal of the first type. In this case, the first inductance is electromagnetically coupled to the second inductance, and the first inductance, the second inductance and the electromagnetic coupling are configured at least partly to compensate for the effect of the parasitic capacitance in the range around a resonant frequency.

In accordance with a further exemplary embodiment, a device comprises at least one transistor. The latter comprises at least one control terminal area, at least one load terminal area, at least one first bond wire having a first bond wire inductance, and at least one second bond wire having a second bond wire inductance. In this case, the at least one first bond wire is conductively connected to the at least one control terminal area and the at least one second bond wire is conductively connected to the at least one load terminal area. Furthermore, the device comprises at least one third bond wire having a beginning and an end, wherein the at least one first bond wire is electromagnetically coupled to a first part of the at least one third bond wire, and the at least one second bond wire is electromagnetically coupled to a second part of the at least one third bond wire. Furthermore, the at least one third bond wire is electrically insulated from the at least one first bond wire and the at least one second bond wire, and the beginning and the end are conductively connected to a reference potential.

In accordance with one exemplary embodiment, the device comprises at least one transistor that is electrically conductively connected to at least one control terminal area and at least one load terminal area. Furthermore, the device comprises at least one control contact area and at least one load contact area and also a first multiplicity of bond wires that are in each case electrically conductively connected to the control terminal area and the control contact area. Furthermore, the device comprises a second multiplicity of bond wires that are in each case electrically conductively connected to the at least one load terminal area and the at least one load contact area, and a third multiplicity of bond wires that have in each case a beginning and an end. Here the beginning and the end are in each case conductively connected to a reference potential, and each of the third multiplicity of bond wires is electrically insulated from the first multiplicity of bond wires and the second multiplicity of bond wires. In addition, the third multiplicity of bond wires and the first multiplicity of bond wires have a first mutual inductance, and the third multiplicity of bond wires and the second multiplicity of bond wires have a second mutual inductance.

The summary above should be understood merely as a brief overview of some possible implementations and should not be interpreted as limiting. In particular, other exemplary embodiments can use features other than those explained above.

DETAILED DESCRIPTION

Figure 1:
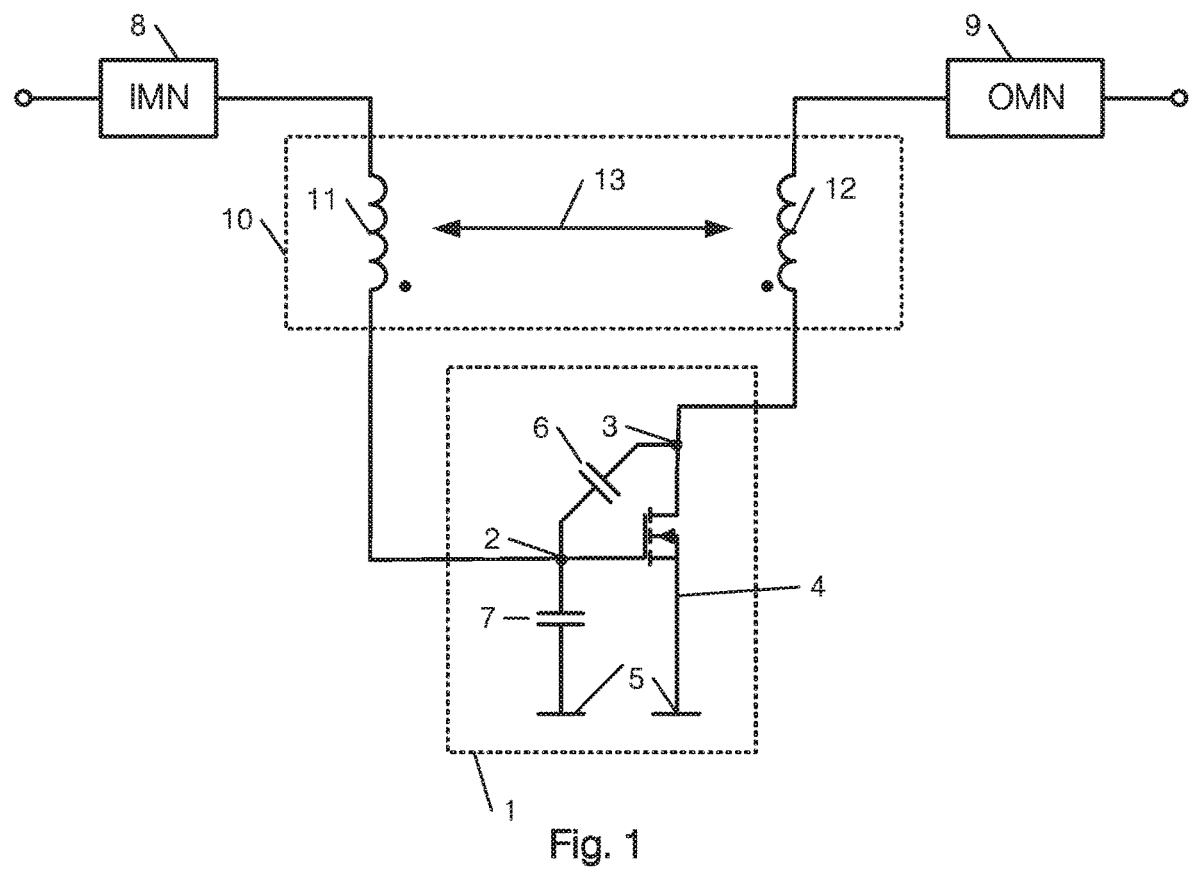
FIG. 1 schematically shows a circuit in accordance with various exemplary embodiments.

Various exemplary embodiments are described in detail below with reference to the accompanying drawings. These exemplary embodiments should be regarded merely as an example and should not be interpreted as limiting. By way of example, in other exemplary embodiments, some of the features or components described may be omitted and/or replaced by alternative features or components. Features or components of different exemplary embodiments can be combined in order to form further exemplary embodiments. Variations and modifications described with regard to one exemplary embodiment may also be applied to other exemplary embodiments. Furthermore, features or components other than those described or shown may be provided, for example features or components used in conventional power amplifier circuits or radiofrequency circuits.

In the figures, identical reference signs designate identical or similar elements. The figures are schematic representations of various exemplary embodiments. Elements illustrated in the figures are not necessarily illustrated in a manner true to scale. Rather, the various elements illustrated in the figures are reproduced in such a way that their function and general purpose become comprehensible to the person skilled in the art.

The techniques and devices described can be used in an extensive field of applications. For example, the stabilization of a transistor, as described below, can find application in association with mobile radio systems, for example 5G and MIMO systems, but also in many fields of application, for example both in modern mobility and industrial systems and in the domestic sector. Moreover, the techniques described can find application in the field of power amplifiers in the field of modern high-power technologies such as GaN systems, for example. The devices can likewise be used in association with so-called intelligent transistors. Intelligent transistors are transistors which are equipped with a plurality of diagnosis capabilities and protective features in order to identify various disturbance conditions. As a result, overload and short-circuit events can be prevented, as a result of which it is possible to design intelligent transistors in a manner optimized in respect of costs and design and to subject them to loading up to the thermal and electrical limits.

Direct connections or couplings which are shown in the drawings or are described below, i.e. electrical connections or couplings without intervening elements (for example simple metal conductor tracks), can also be realized by an indirect connection or coupling, i.e. a connection or coupling comprising one element or a plurality of additional intervening elements, and vice versa, as long as the general functioning of the connection or coupling, for example providing a voltage, providing a current or providing a control signal, is substantially maintained.

Conductively connected denotes a coupling that enables DC voltage and/or AC voltage to be transmitted. A conductive connection can be realized for example by means of continuous metallic lines. Moreover, a conductive connection can be realized for example by means of a conductive area.

In general, transistors in the context of the present application have one or a plurality of control terminals and two or more load terminals. Opening and closing the transistor (actuating the transistor) can be controlled by applying one or a plurality of signals to the one or the plurality of control terminals. If the transistor is closed, it provides a low-impedance connection between at least two of its load terminals, such that a current can flow between the load terminals. If the transistor is open, the transistor exhibits a blocking behavior between its load terminals, that is to say that it is at high impedance, such that substantially no current can flow between the load terminals, e.g. with the exception of the undesired effects such as a leakage current, etc., that can occur in real devices.

Many transistors have a transition region between the closed state and the open state, in which gradual opening of the transistor can be controlled by means of the one or the plurality of control terminals. Some transistors can have, at least in a part of the transition region, a linear dependence between control terminal signal and impedance characteristic of the connection between the at least two load terminals. In some amplifier arrangements, transistors are operated in this linear part of the transition region.

Some transistors can have parasitic, i.e. undesired, capacitances between individual terminals. By way of example, parasitic capacitances can occur between at least one control terminal and at least one load terminal, and/or between a first load terminal and a second load terminal.

In some exemplary embodiments, the transistor can be a transistor in particular for radiofrequency and power applications (RF power transistor). In some exemplary embodiments, the transistor can be implemented using a field effect transistor (FET) such as a MOS transistor (MOSFET), an insulated gate bipolar transistor (IGBT), a junction field effect transistor (JFET), a bipolar transistor (BJT), a gallium nitride transistor (GaN transistor), a silicon carbide transistor (SiC transistor) or a high electron mobility transistor (HEMT). In such cases, the load terminals can comprise at least one load terminal of a first type and at least one load terminal of a second type.

In the case of a field effect transistor, the at least one load terminal of the first type can correspond to one drain terminal or a plurality of drain terminals and the at least one load terminal of the second type can correspond to one source terminal or a plurality of source terminals, while the at least one control terminal can correspond to the gate terminal or the gate terminals.

In the case of a bipolar transistor or an insulated gate bipolar transistor, the at least one load terminal of the first type can correspond to one collector terminal or a plurality of collector terminals and the at least one load terminal of the second type can correspond to one emitter terminal or a plurality of emitter terminals. Emitter terminal/terminals and collector terminal/terminals can also be interchanged between the first and second types. In the case of a bipolar transistor, the at least one control terminal can correspond to the base terminal or a plurality of base terminals. In the case of an insulated gate bipolar transistor, the at least one control terminal can correspond to the gate terminal or a plurality of gate terminals.

The devices can comprise a die. Die denotes a semiconductor chip, which can also be combined with other semiconductor chips.

The devices can comprise a chip package. The chip packages can provide an encapsulation of a semiconductor chip including terminal locations, for example leads, pins or balls. Numerous variations of such chip packages are known to the person skilled in the art, which differ in their shape, the materials used, the number and arrangement of the terminal locations and other properties.

In some transistors, a so-called parasitic capacitance, that is to say capacitance that is undesired or dictated by the design, but not required, can occur. Such parasitic capacitances can occur in particular between different terminals of the transistor. By way of example, a parasitic capacitance can occur between a control terminal and a load terminal. As mentioned above, in the case of field effect transistors said parasitic capacitance can occur between a gate terminal and a drain terminal. In these cases, this is referred to as a gate-drain capacitance, often designated by $C_{gd}$. In some other cases, a capacitance can occur between a gate terminal and the source terminal. In these cases, this is referred to as a gate-source capacitance, often designated by $C_{gs}$. In other types of transistors, corresponding capacitances can occur between the different terminals.

Inductance within the meaning of this application denotes components or regions of components that have the property of having an electrical inductance.

Examples of inductances in association with this application can be coils, conductor tracks, conductor track sections, individual lines, individual bond wires, a plurality of bond wires and/or sections of individual or a plurality of bond wires. This enumeration should not be interpreted as limiting, but rather serves merely for elucidation. The inductance properties can be altered by altering the components, in particular the component geometries.

In the context of this description, electromagnetic coupling or mutual induction is understood to mean the mutual magnetic influencing of two or more spatially adjacent inductances on account of electromagnetic interaction. Quantitatively the electromagnetic coupling or mutual induction between two inductances can be described with the aid of coupling coefficients.

Sign and magnitude of the coupling coefficient between two inductances depend on numerous parameters and can be altered by altering these parameters, for example by altering the distances, the arrangement and the shape and the respective geometric properties of the inductances, for example dimensions and shape of the conductive elements of the inductances.

In association with this application, resonant frequency is understood to mean the resonant frequency of a resonant circuit, for example of a capacitance with an inductance and/or a resistance.

FIGS. 1, 2, 3 and 4 each show a transistor 1 that is coupled to a reference potential 5, an input matching network 8 and an output matching network 9. The transistor 1 has a control terminal 2, a load terminal of a first type 3 and a load terminal of a second type 4. Between the control terminal 2 and the load terminal of the first type 3, the transistor 1 has a first parasitic capacitance 6. Furthermore, the transistor 1 can additionally have a second parasitic capacitance 7 between the control terminal 2 and the reference potential 5. Furthermore, the transistor 1 can have further parasitic capacitances, not shown in FIGS. 1-4.

In some embodiments, the transistor 1 can be a power transistor. The control terminal 2 can be a gate terminal, the load terminal of the first type 3 can be a drain terminal, and the load terminal of the second type 4 can be a source terminal. In these embodiments, the parasitic capacitance 6 is designated as gate-drain capacitance, $C_{gd}$.

FIG. 1 schematically shows a circuit in accordance with various exemplary embodiments.

In the exemplary embodiment shown, the circuit furthermore has a feedback network 10 in addition to the transistor 1 described above, said feedback network comprising a first inductance 11 and a second inductance 12, wherein the first inductance 11 and the second inductance 12 have an electromagnetic coupling 13.

Said electromagnetic coupling can be configured at least partly to compensate for the effect of the first parasitic capacitance 6 during operation of the transistor 1 in the range around a resonant frequency. This can be done by a suitable choice of the coupling, for example by the arrangement of the conductor tracks and a suitable choice of the first inductance 11 and the second inductance 12.

An at least partial compensation of the first parasitic capacitance 6 in a frequency range is present if around a center frequency within a specific bandwidth the coupled elements are designed such that they form a resonant circuit with the first parasitic capacitance 6, wherein the resonant circuit is suitable for compensating for the effect of the first parasitic capacitance 6 within the bandwidth, such that the circuit effectively behaves as though the first parasitic capacitance 6 were not present, and the circuit thus behaves as though there were no parasitic connection between the control terminal 2 and the load terminal of the first type 3 in this frequency range, or the effects of the parasitic capacitance are at least reduced.

One advantage of some of these exemplary embodiments and of exemplary embodiments explained below may consist in the fact that it is possible to achieve an almost ideal behavior in the change of impedance as a function of frequency for amplifier circuits, for example for Doherty amplifier circuits. This can simplify the design of efficient amplifiers for a wide frequency range and at high frequencies.

Depending on the desired frequency range and the power class of the circuit, the inductances can be provided by means of bond wires, as will also be explained on the basis of exemplary embodiments below.

A circuit in accordance with these embodiments and embodiments described below can afford the advantage of an inductive feedback that is DC voltage-decoupled.

DC voltage-decoupled means that the feedback acts as electrical insulation for DC voltages, or low-frequency voltages. By way of example, on account of the DC voltage decoupling between the control terminal and the load terminal of the first type, it may be possible to dispense with an additional capacitance required in RLC networks for DC voltage decoupling.

A circuit in accordance with various embodiments above and described below can have the property that the circuit can manage without an additional resistance for stabilizing possible undesired oscillation behavior on account of the elements used for compensating for the parasitic capacitance 6, such as can occur for example on account of the series connection of capacitance and inductance in an RLC compensation network.

Further effects may consist in an almost ideal amplification behavior as a function of the load and also reduced losses and thus an increased efficiency.

Figure 2:
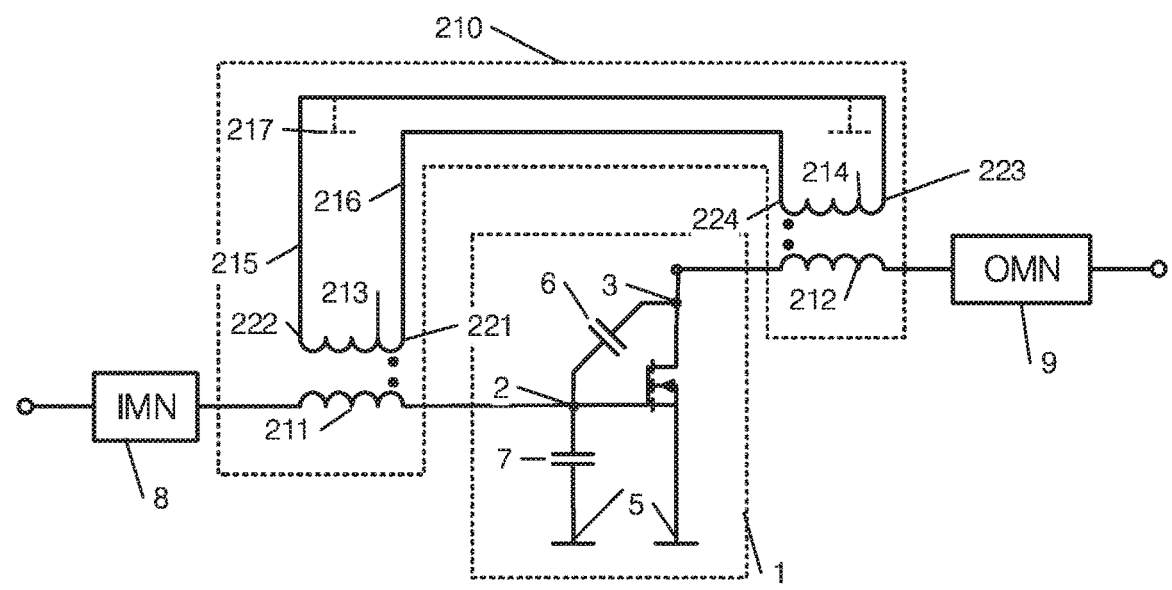
FIG. 2 schematically shows a circuit in accordance with various exemplary embodiments.

FIG. 2 schematically shows a circuit in accordance with various exemplary embodiments.

FIG. 2 shows a circuit having a transistor 1, to which the above explanations concerning the transistor 1 are correspondingly applicable.

The circuit shown in FIG. 2 comprises a first inductance 211, a second inductance 212, a third inductance 213 having a first terminal 221 and a second terminal 222, and also a fourth inductance 214 having a third terminal 223 and a fourth terminal 224. The one second terminal 222 is conductively connected to the one third terminal 223 by means of a first line 215. The first terminal 221 is conductively connected to the fourth terminal 224 by means of a second line 216. In the exemplary embodiment shown in FIG. 2, the first line 215 is coupled to a reference potential 217. In some exemplary embodiments, the second line 216 can also alternatively or additionally be coupled to a reference potential 217. Said reference potential 217 can correspond to the reference potential 5 of the transistor 1.

There is an electromagnetic coupling between the first inductance 211 and the third inductance 213, and also between the second inductance 212 and the fourth inductance 214. As a result, the circuit can have a total coupling comprising the respective mutual couplings of first inductance 211, second inductance 212, third inductance 213 and fourth inductance 214, which in the interaction thereof can provide an effective coupling between the first inductance 211 and the second inductance 212 which can be one exemplary embodiment of the coupling 13 shown in FIG. 1.

These exemplary embodiments can likewise afford the advantages mentioned above. Furthermore, the lines 215, 216 can offer flexibility in the realization of the circuit since the connection of lines to additional inductances enables more degrees of freedom for the design of the respective inductances and the arrangement thereof. The possibility of a coupling of a line to the reference potential 217, which can also additionally or alternatively be effected elsewhere, for example at 216, can offer simplifications in the realization, as will also be explained below in association with further exemplary embodiments.

The embodiments described in association with FIG. 2 are suitable in particular for the embodiment of the inductances by means of bond wires, but are not restricted thereto. An implementation can likewise be effected for example by means of planar inductances, coils and transformers.

The feedback network 210 can be configured without a conductive connection or with a conductive connection to a reference potential, for example ground. This can enable further configuration freedoms and hence design advantages. By way of example, one or both of the lines 215, 216 shown can be configured by means of conductive connections to a conductive area.

Figure 3:
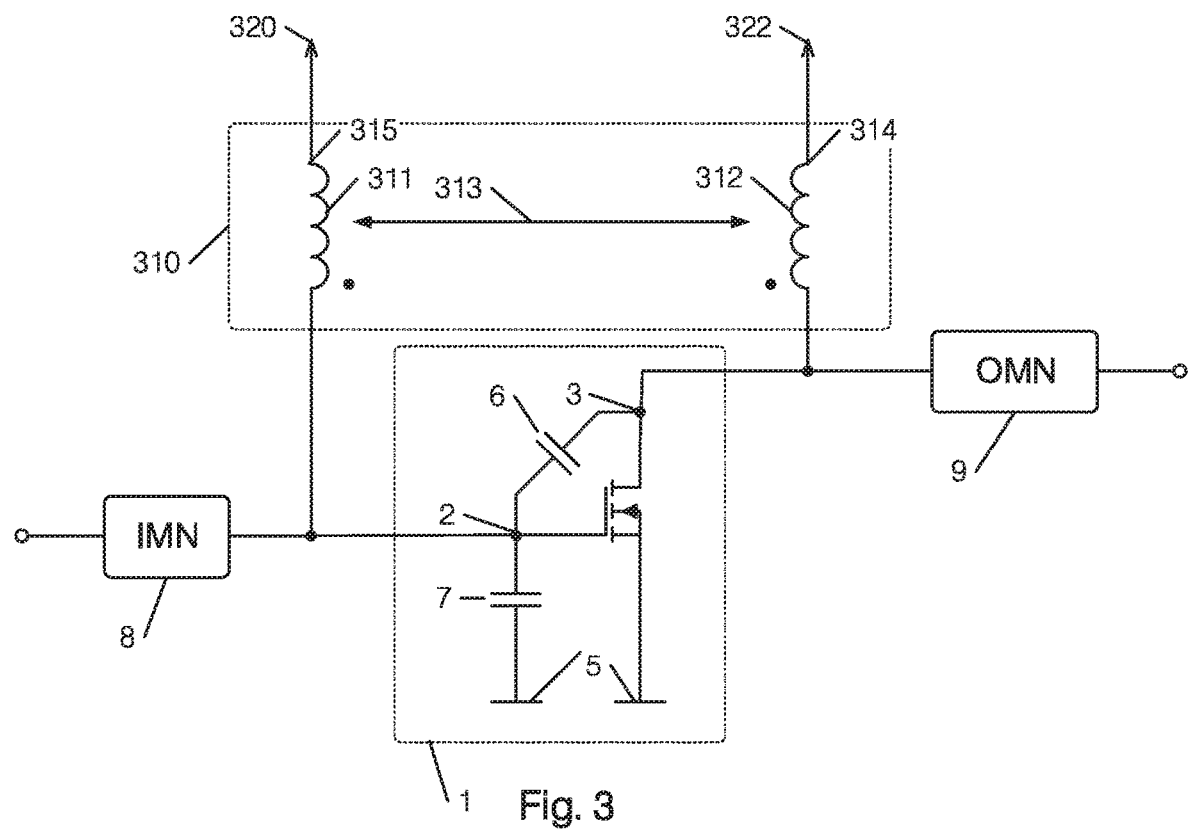
FIG. 3 schematically shows a circuit in accordance with various exemplary embodiments.

FIG. 3 schematically shows a circuit in accordance with various exemplary embodiments.

FIG. 3 once again shows a transistor 1 to which the explanations concerning the transistors 1 from FIG. 1 are correspondingly applicable and which is used in a comparable circuit context in the exemplary embodiment shown.

The exemplary embodiments illustrated in FIG. 3 comprise a feedback network 310. A terminal 313 of the first inductance 311 is conductively connected to a control terminal 320, and a terminal 314 of the second inductance 312 is conductively connected to a power terminal of a first type 322. The inductances 311, 312 can make it possible to decouple the terminals 320 and 322 from AC voltage signals, for example RF signals. Consequently, via the terminals 320, 322 it may be possible to couple a DC voltage to the transistor 1, which voltage can be superposed with AC voltage signals additionally present. It is thereby possible, for example, for an RF signal provided from the input matching network 8 to be superposed with a DC voltage signal provided at the terminal 320 at the control terminal 2 of the transistor. By means of the DC voltage signal, in some exemplary embodiments it is possible to choose a gain if the transistor is operated in a linear regime. In some exemplary embodiments, the transistor 1 is a field effect transistor. In that case the control terminal 320 can be a gate control terminal, and the power terminal of the first type 322 can be a drain supply terminal.

In FIG. 3, the inductive coupling 313 which, in the exemplary embodiments in accordance with FIG. 1, is in each case connected in series with the input matching network (IMN; from English term "input matching impedance") 8 and the output matching network (OMN; from English term "output matching impedance") 9 is alternatively realized in the form of a parallel connection. This affords a further possibility for compensating for the parasitic capacitance 6. This circuit, too, can compensate for the feedback of the parasitic capacitance in the transistor by a suitable choice of the values of the respective inductances and/or of the coupling coefficients. The conductive connection in the sense of a coupling to a control terminal 320 and a power terminal of a first type 322 should be understood only as an example. In particular interposed components or other supply voltages are possible.

Figure 4:
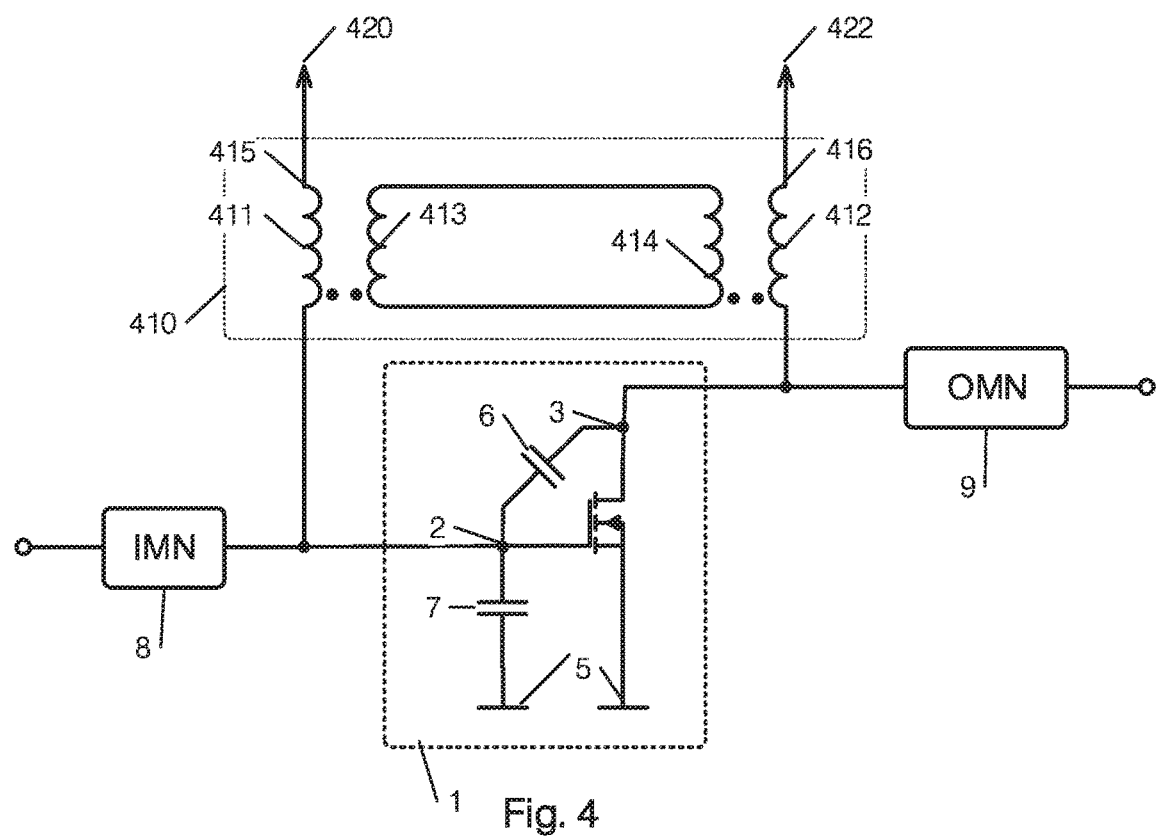
FIG. 4 schematically shows a circuit in accordance with various exemplary embodiments.

FIG. 4 schematically shows a circuit in accordance with various exemplary embodiments.

FIG. 4 once again shows a transistor 1 to which the explanations concerning the transistor 1 from FIG. 2 are correspondingly applicable and which is used in a comparable circuit context in the exemplary embodiment shown.

In the exemplary embodiments illustrated in FIG. 4, a terminal 415 of the first inductance 411 is conductively connected to a control terminal 420 and a terminal 416 of the second inductance 412 is conductively connected to a power terminal of a first type 422. In some exemplary embodiments, the control terminal 420 can be a gate control terminal, and the power terminal of the first type 422 can be a drain terminal.

As a result, the inductive coupling network 410, comprising a third inductance 413 and a fourth inductance 414, which is shown in FIG. 2 in each case in a manner connected in series with the input matching network (IMN) 8 and the output matching network (OMN) 9, can be realized in the form of a parallel connection as shown in FIG. 4. This can offer greater design freedom for the compensation of the parasitic capacitance 6 in some exemplary embodiments.

The inductances that are electromagnetically coupled to one another can have different types of electromagnetic coupling.

In this regard, the electromagnetic coupling of the first inductance 411 and the third inductance 413 and also of the second inductance 412 and the fourth inductance 414 can have a positive coupling coefficient in each case.

Figure 5:
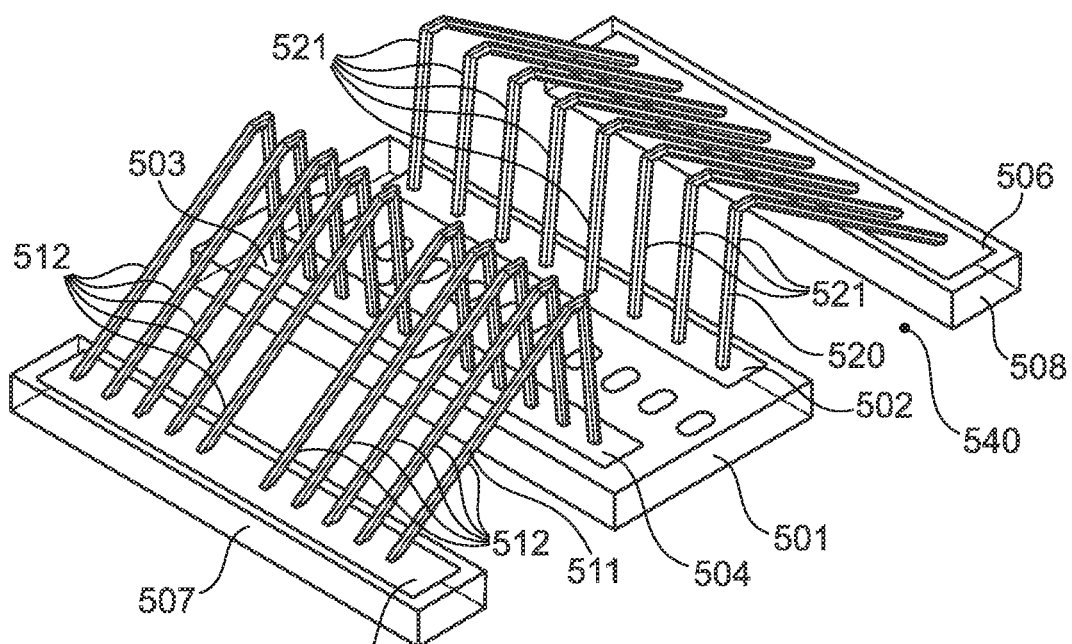
FIG. 5 schematically shows a comparative example.

FIG. 5 schematically shows a comparative example with respect to one exemplary embodiment, which is then described below with reference in association with FIG. 6.

FIG. 5 shows a device that can be applied on a printed circuit board, for example. The printed circuit board can comprise a substantially conductive plane at a reference potential 540, wherein the reference potential can be a ground potential. At least one transistor is present on the rear side of an insulator 501. FIG. 5 shows a configuration for two transistors in a housing on the rear side of the insulator 501. The insulator 501 additionally comprises at least one control terminal area, in this case a first control terminal area 504 and a second control terminal area 503, and also at least one first load terminal area 502.

Furthermore, two further insulators 507, 508 are provided. At least one control contact area 505 is situated on one of the insulators 507, and at least one load terminal contact area 506 is situated on the other insulator 508.

The insulators 501, 507, 508 described here are shown merely by way of example; alternative implementations are possible. In this regard, the substantially conductive plane at a reference potential 540 can also be configured such that an insulating effect occurs as a result of interruptions.

By means of the contact areas 505, 506 and possible further contact areas, it is possible to produce contacts to further circuit parts (not illustrated).

At least one first bond wire 511 conductively connects the at least one control terminal area 503, 504 to the at least one control contact area 505. At least one second bond wire 520 conductively connects the at least one load terminal area 502 to the at least one load contact area 506. These connections can be realized in particular by a first multiplicity of bond wires 512, which can have a similar geometry as shown here, but also a different geometry. In FIG. 5, this is shown as an example on the basis of the first multiplicity of bond wires 512 and the second multiplicity of bond wires 521.

Figure 6:
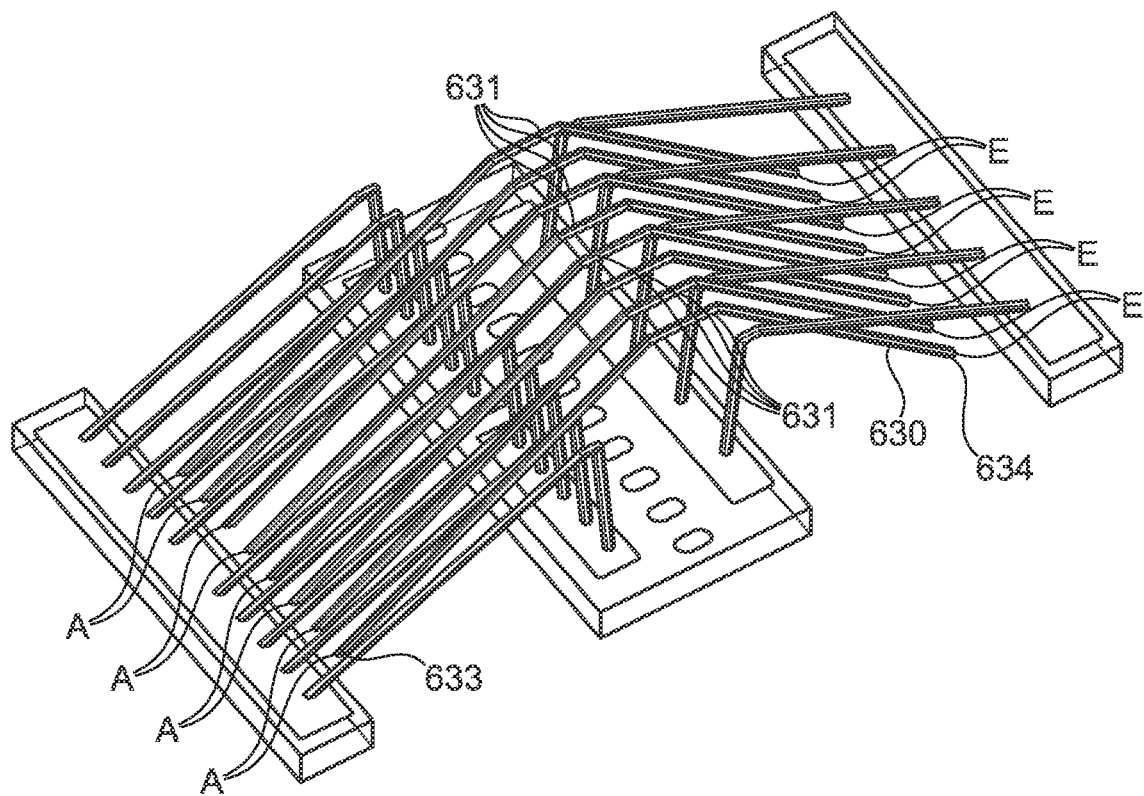
FIG. 6 schematically shows one possible implementation of the circuit from FIG. 4 in accordance with various exemplary embodiments.

FIG. 6 schematically shows one possible implementation of the circuit from FIG. 4 in accordance with various exemplary embodiments.

The reference signs of the comparative example from FIG. 5 are adopted in FIG. 6, wherein identical reference signs designate identical elements.

FIG. 6 shows, proceeding from the device discussed with reference to FIG. 5, one possible implementation of the circuit from FIG. 4 in accordance with various exemplary embodiments. In accordance with some exemplary embodiments, the coupling network 410 known from FIG. 4 can be realized by means of at least one first third bond wire 630 or a third multiplicity of bond wires 631. The at least one bond wire 630 or the third multiplicity of bond wires 631 has/have in each case a beginning 633 and an end 634. Beginning and end are conductively connected to the reference potential 540. The at least one third bond wire 630 or the third multiplicity of bond wires 631 is/are in each case electrically insulated from the first multiplicity of bond wires 512 and the second multiplicity of bond wires 521 that are likewise shown in FIG. 4. In accordance with some exemplary embodiments, the effect of the first inductance 411 described in FIG. 4 can be brought about by the at least one first bond wire 511 or the first multiplicity of bond wires 512, and the effect of the second inductance 412 can be brought about by the at least one second bond wire 520 or the second multiplicity of bond wires 521. By means of the arrangement of the at least one third bond wire 630 and the connection to the reference potential 540, an effect corresponding to the third inductance 413 and the fourth inductance 414 from FIG. 4 can be achieved on account of the geometric properties at different regions of the at least one third bond wire 630. In accordance with some embodiments shown in FIG. 6, this effect is provided by the third multiplicity of bond wires 631, which in each case have, in the region of the first multiplicity of bond wires 512, mutual inductances with the first multiplicity of bond wires 512 and, in the region of the second multiplicity of bond wires 521, mutual inductances with the second multiplicity of bond wires 521, which are suitable for having an effect as described in association with FIG. 4, which comprises in particular an electromagnetic coupling of the at least one first bond wire 511 to a first part of the at least one third bond wire 630 and an electromagnetic coupling of the at least one second bond wire 520 to a second part of the at least one third bond wire 630.

The electromagnetic coupling between the at least one third bond wire 630 and the at least one first bond wire 511 and also between the at least one third bond wire 630 and the at least one second bond wire 520 can be configured, in particular, at least partly to compensate for the effect of a parasitic capacitance between the at least one control terminal area 504 and the at least one load terminal area 502 in the range around a resonant frequency.

The bond wire wiring scheme explained here as an example can find application for a multiplicity of transistors in different designs. This encompasses, inter alia, transistors incorporated in ceramic housings but also a solution applied directly on the circuit board and also similar substrate/material technologies. In this case, it is possible to use bond wires for die-to-die connections. The bond wires 521, 512 shown can also extend within a chip housing, such as a ceramic housing, for example.

The device shown in FIG. 6 can be realized as a component and also in integrated circuits (ICs); however, other types of implementation are also possible.

Figure 7:
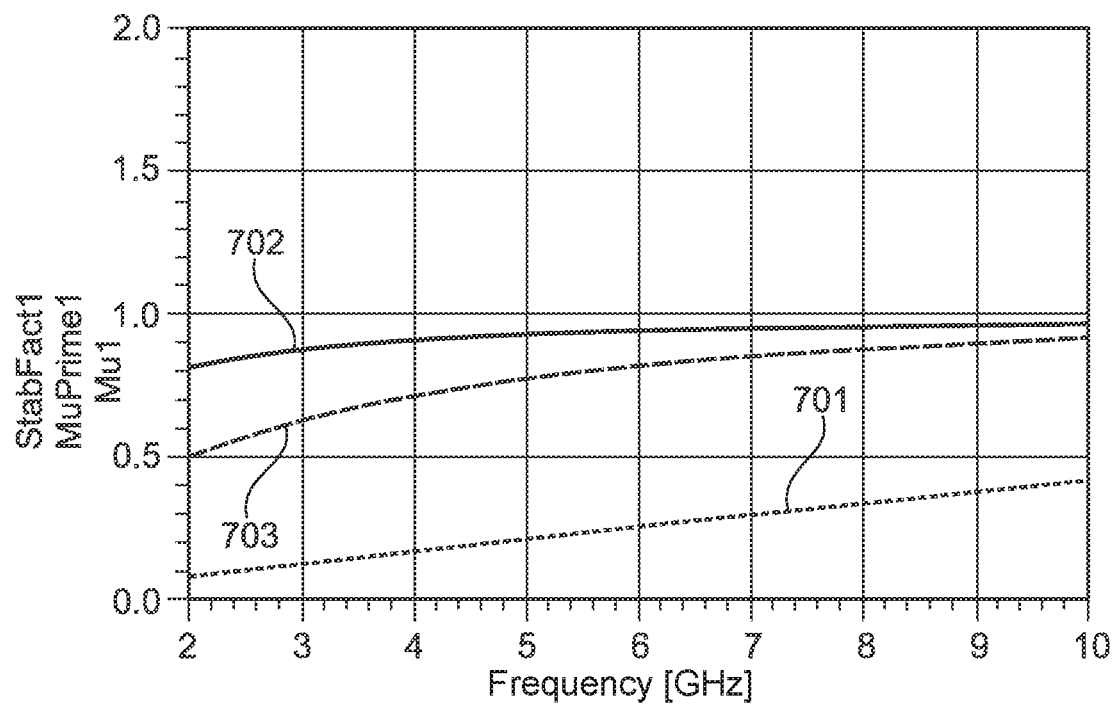
FIG. 7 shows simulations of various stability parameters as a function of frequency from the comparative example in FIG. 5.

FIG. 7 shows simulations of various stability parameters as a function of frequency from a comparative example corresponding to FIG. 5.

In FIG. 7, the profile of stability parameters for a circuit in accordance with the comparative example corresponding to FIG. 5 is plotted for a specific frequency range. The illustration shows the k-factor 701 and also the geometric stability parameters $\mu'$ 702 and $\mu1$ 703, which can be used to assess whether an unstable behavior of the circuit must be expected for specific impedance values. In the present case, these three parameters assume values of less than 1 over the entire value range shown, that is to say that an unstable behavior may be present.

Figure 8:
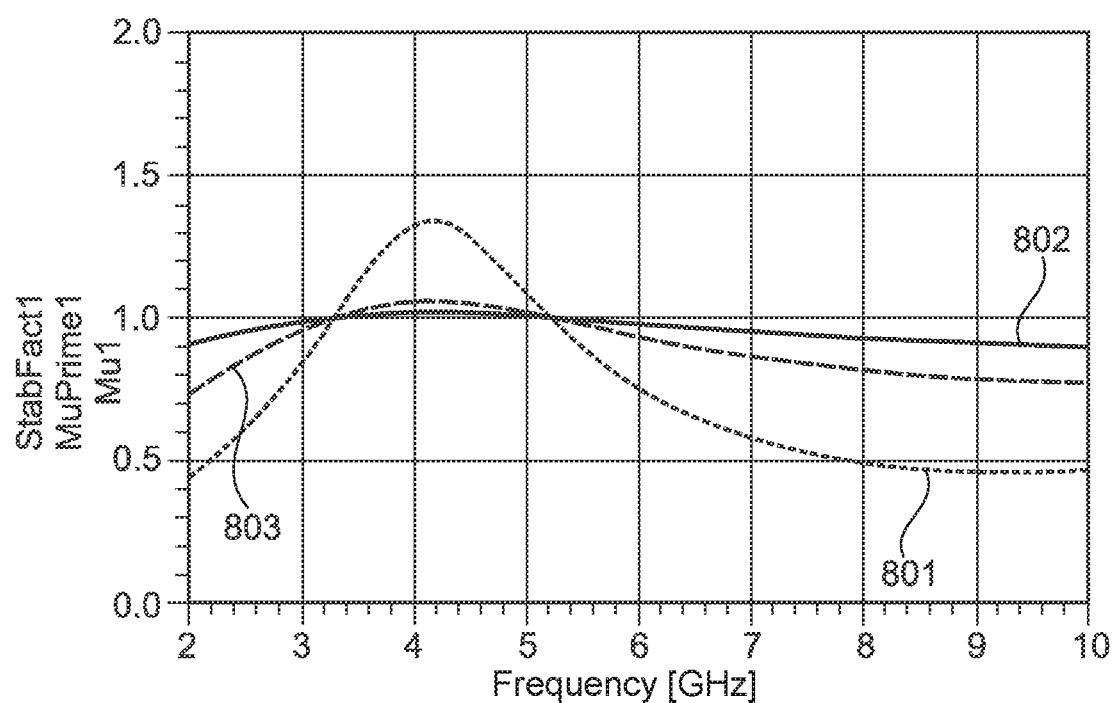
FIG. 8 shows simulations of various stability parameters as a function of frequency in accordance with the exemplary embodiment in FIG. 6.

FIG. 8 shows simulations of various stability parameters as a function of frequency in accordance with one exemplary embodiment.

In FIG. 8, the profile of stability parameters for a circuit in accordance with various exemplary embodiments is plotted for a specific frequency range. Once again, the illustration shows the k-factor 801 and also the geometric stability parameters $\mu'$ 802 and $\mu1$ 803. The feedback network in accordance with various exemplary embodiments makes it possible for the stability behavior to be significantly improved. It is likewise possible that a parameter-independent stability around a resonant frequency can be achieved, which may be the case for stability values of more than 1. In FIG. 8 this is the case in the frequency range around 4 GHz.

The simulation curves shown in FIGS. 7 and 8 serve merely for elucidation; in particular, profile shapes and numerical values should not be interpreted as limiting and depend on the choice of parameters.

Although specific exemplary embodiments have been illustrated and described in this description, persons who have routine knowledge in the art will recognize that a multiplicity of alternative and/or equivalent implementations can be chosen as substitution for the specific exemplary embodiments shown and described in this description, without departing from the scope of the invention shown. The intention is for this application to cover all adaptations or variations of the specific exemplary embodiments discussed here. Therefore, the intention is for this invention to be restricted only by the claims and the equivalents of the claims.

What is claimed is:

1. A device, comprising:
   a transistor having a control terminal, a load terminal of a first type and a load terminal of a second type,
   wherein the transistor has a parasitic capacitance between the control terminal and the load terminal of the first type, a first inductance conductively connected to the control terminal, and a second inductance conductively connected to the load terminal of the first type,
   wherein the first inductance is electromagnetically coupled to the second inductance,
   wherein the first inductance, the second inductance and the electromagnetic coupling are configured at least partly to compensate for an effect of the parasitic capacitance in a range around a resonant frequency.

2. The device of claim 1, further comprising:
   a third inductance; and
   a fourth inductance,
   wherein the third inductance has a first terminal and a second terminal,
   wherein the fourth inductance has a third terminal and a fourth terminal,
   wherein the second terminal is conductively connected to the third terminal,
   wherein the first terminal is conductively connected to the fourth terminal,
   wherein the electromagnetic coupling comprises:
      a first electromagnetic coupling between the first inductance and the third inductance; and
      a second electromagnetic coupling between the second inductance and the fourth inductance.

3. The device of claim 2, wherein a terminal of the first inductance is conductively connected to a control terminal, and wherein a terminal of the second inductance is conductively connected to a power terminal of a first type.

4. The device of claim 2, wherein the electromagnetic coupling of the first inductance and of the third inductance has a subtractive polarity, and wherein the electromagnetic coupling of the second inductance and of the fourth inductance has a subtractive polarity.

5. The device of claim 1, wherein a terminal of the first inductance is conductively connected to a control terminal, and wherein a terminal of the second inductance is conductively connected to a power terminal of a first type.

6. The device of claim 1, wherein at least one of the inductances is realized by at least one bond wire.

* * * * *